(12) United States Patent
Venom et al.

(10) Patent No.: US 9,190,113 B2
(45) Date of Patent: Nov. 17, 2015

(54) DOCKING DEVICE FOR A HARD DISK

(75) Inventors: Didier Venom, Rueil Malmaison (FR); Dominique Susini, Rueil Malmaison (FR); Grégory Sonjon, Rueil Malmaison (FR)

(73) Assignee: SAGECOM BROADBAND SAS, Rueil Malmaison (FR)

( * ) Notice: Subject to any disclaimer, the term of this patent is extended or adjusted under 35 U.S.C. 154(b) by 177 days.

(21) Appl. No.: 13/377,467

(22) PCT Filed: Jul. 21, 2010

(86) PCT No.: PCT/EP2010/060552
§ 371 (c)(1),
(2), (4) Date: Dec. 9, 2011

(87) PCT Pub. No.: WO2011/009881
PCT Pub. Date: Jan. 27, 2011

(65) Prior Publication Data
US 2012/0092829 A1 Apr. 19, 2012

(30) Foreign Application Priority Data
Jul. 24, 2009 (FR) ...................................... 09 03652

(51) Int. Cl.
*H05K 7/20* (2006.01)
*G11B 33/14* (2006.01)
*G06F 1/16* (2006.01)

(52) U.S. Cl.
CPC .......... *G11B 33/1413* (2013.01); *G06F 1/1658* (2013.01); *G11B 33/142* (2013.01); *H05K 7/20145* (2013.01); *H05K 7/20172* (2013.01); *H05K 7/20727* (2013.01); *H05K 2201/09072* (2013.01)

(58) Field of Classification Search
CPC .......... H05K 7/20145; H05K 7/20172; H05K 7/20727; H05K 7/205; H05K 7/20518; H05K 2201/09072; G06F 1/1658; G11B 33/142; G11B 33/1413
USPC ................................ 361/679.48–679.51, 695
See application file for complete search history.

(56) References Cited

U.S. PATENT DOCUMENTS

| 5,121,290 A * | 6/1992 | Azar ...................... H01L 23/467 |
|---|---|---|
| | | 257/E23.099 |
| 5,694,294 A | 12/1997 | Ohashi |
| 6,115,252 A * | 9/2000 | Ohta et al. .................... 361/700 |
| 6,141,214 A | 10/2000 | Ahn |
| 6,229,507 B1 * | 5/2001 | Nakamura et al. .............. 345/82 |
| 6,400,563 B1 * | 6/2002 | Mohi et al. ............... 361/679.47 |
| 7,447,021 B2 * | 11/2008 | Chen ............................ 361/695 |

(Continued)

FOREIGN PATENT DOCUMENTS

WO WO-2007/041186 A2 4/2007

*Primary Examiner* — Anatoly Vortman
*Assistant Examiner* — Jacob Crum
(74) *Attorney, Agent, or Firm* — Muncy, Geissler, Olds & Lowe, P.C.

(57) ABSTRACT

A docking device for a hard disk has a protective box housing an electronic unit including a printed circuit card and a fan arranged in or in the vicinity of an opening formed in a first wall of the protective box. The box also has a location for a hard disk. The fan is arranged in the vicinity of an edge of the printed circuit card so that the air stream driven by said fan sweeps over both main faces of the printed circuit card. The guide is designed to guide at least a portion of the air stream driven by the fan directly to the location for a hard disk.

17 Claims, 2 Drawing Sheets

(56) References Cited

U.S. PATENT DOCUMENTS

| | | |
|---|---|---|
| 7,957,133 B2 * | 6/2011 | Zieman et al. ........... 361/679.51 |
| 2002/0051338 A1 | 5/2002 | Jiang |
| 2005/0240949 A1 | 10/2005 | Liu |
| 2006/0067046 A1 | 3/2006 | Dey |
| 2006/0120043 A1 * | 6/2006 | Wolford ............... H05K 1/0272 361/695 |
| 2007/0047202 A1 | 3/2007 | Itoh |
| 2007/0206353 A1 * | 9/2007 | Boone et al. .................. 361/694 |

* cited by examiner

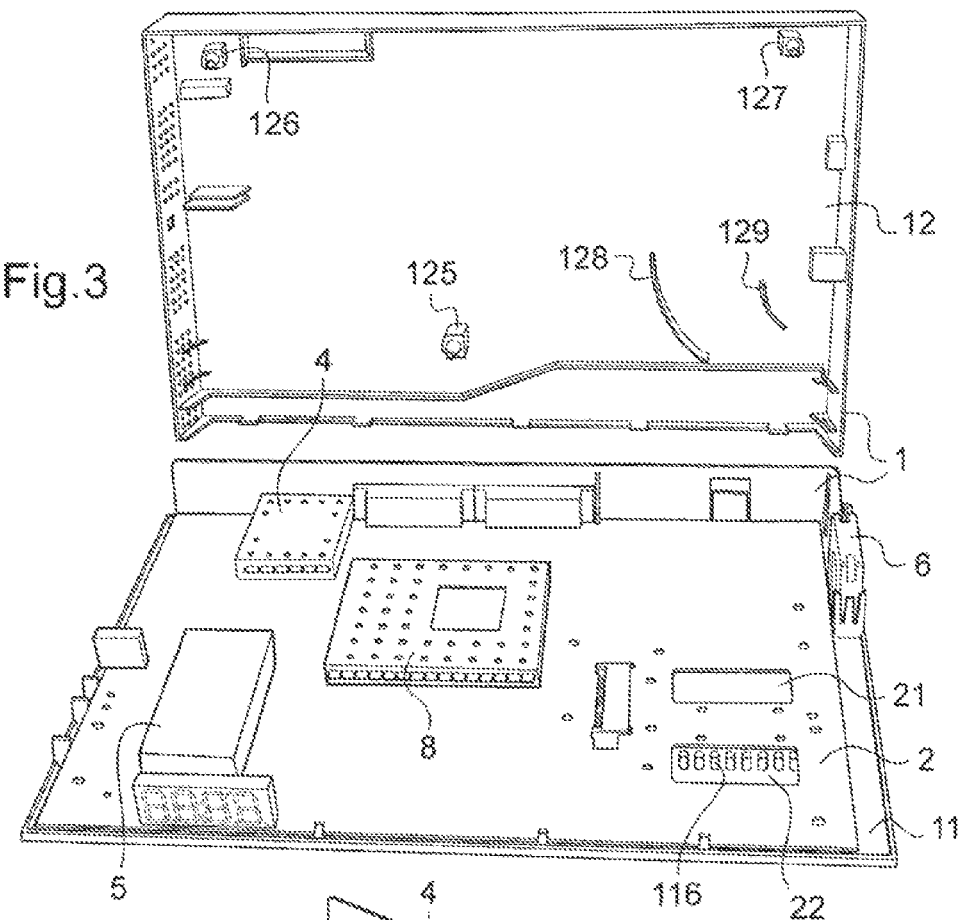
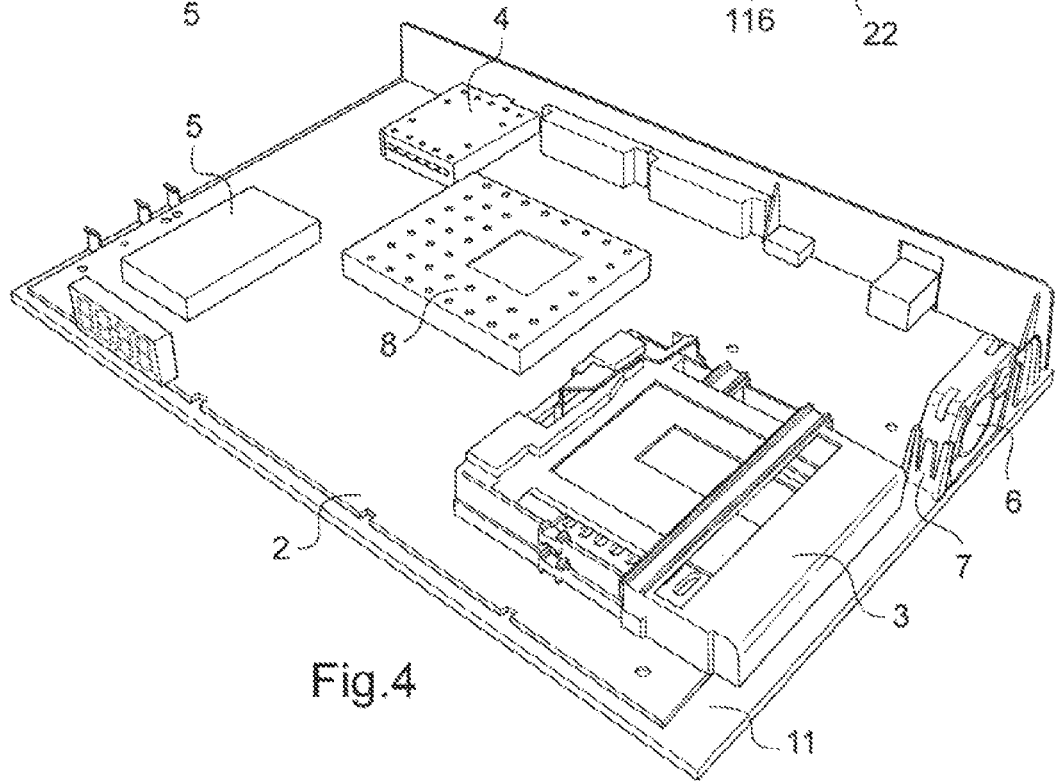

DOCKING DEVICE FOR A HARD DISK

BACKGROUND OF THE INVENTION

1. Field of the Invention

The present invention relates to a device for docking a hard disk and to the electronic equipment fitted with such a device. Such equipment may for example be audiovisual equipment, such as a decoder or an optical reader for reading a DVD type disk, for connection to a TV set and including a data recording function, in particular for making TV or audiovisual recordings on a hard disk. The hard disk may be designed to be removable without dismantling the equipment.

2. Brief Summary of the Related Art

Generally, this type of device comprises a box that defines a housing in which a printed circuit card is arranged that has various electronic components mounted thereon. It is generally also on the card that the component(s) enabling the hard disk to be inserted are also mounted, in order to provide the appropriate electrical and electronic connections and in order to make extraction easy when the hard disk is designed to be removable. The box provides mechanical protection for all of these components and also gives the device a compact nature of attractive appearance.

At least some of the components contained in the box are liable to become hot in normal operation, and it is therefore appropriate to provide means for exchanging heat between the inside of the box and its external environment in order to cool them. Such heat exchange means may in particular be: ventilation openings formed in the walls of the box, possibly in association with forced ventilation means (fans); using a box having its walls made at least in part out of a metal-type material that conducts heat; or indeed using finned radiators.

The fact that devices of this type are liable to contain a hard disk adds an additional constraint in thermal terms, insofar as a hard disk also tends to become hot and it is necessary to keep it at an operating temperature that is generally lower than the operating temperature of the other electronic components, in particular the microprocessor. It is therefore necessary to have a cooling system that presents particularly good performance.

Unfortunately, the various above-mentioned technical solutions are not optimal.

It is not always desirable to make ventilation openings where they would be the most advantageous from a thermal point of view, e.g. in the top of the box, both for reasons of appearance and also to avoid dust collecting inside the box.

Similarly, the use of finned radiators is effective from a thermal point of view but not acceptable for the same reasons of appearance and of running the risk of collecting dust.

Finally, although fans can be used to force air convection inside the box, the way they are configured does not always lead to effective cooling of all of the components that might become hot, particularly those components that are farthest away from the fan. And in particular for reasons of bulk, it is not always possible to use the most powerful fans since they are generally much too large in size.

SUMMARY OF THE INVENTION

An object of the invention is thus to remedy the drawbacks of prior solutions for cooling components that are likely to become hot in this type of device. The invention seeks in particular to devise improved cooling means that are effective from a thermal point of view and that preserve the appearance and the cleanliness of the device in normal use.

The invention provides a docking device for a hard disk, the device comprising a protective box housing an electronic unit including a printed circuit card and fan means arranged in or in the vicinity of an opening formed in a first wall of the protective box, said box also providing a location for a hard disk. According to the invention, the fan means are arranged in the vicinity of an edge of the printed circuit card so that the air stream driven by said fan means sweeps over both main faces of the printed circuit card, and guide means are provided for guiding at least a portion of the air stream towards the location for a hard disk.

The invention thus proposes cooling simultaneously the top face and the bottom face of the printed circuit card, and doing this with only one fan means, thus making it possible to increase the effectiveness of the cooling of the card and of the components it carries without making the device more complicated, and as a result then making it possible to omit the openings formed in the top of the device without significant harm from a thermal point of view. The guide means associated with the fan means ensure that a portion of the air stream does indeed cool the hard disk when inserted in the device, thereby making the fan more effective in its cooling action and without needing it to be overdimensioned.

Advantageously, the electronic components are mounted on the printed circuit card, and guide means are also provided for guiding at least a portion of the air stream towards at least one of said embodiment components, in particular a microprocessor and a tuner.

These variant guide means are advantageously arrangements in the box and the card that enable the air that is driven into the box by the fan to be channeled and/or exhausted: these comprise in particular openings and projecting elements of the rib or deflector type, or indeed portions in relief of the step and/or ramp type arranged in the inside walls of the box, and also openings formed through the printed circuit card itself.

Preferably, the fan is of the axial type with a propeller that is driven by an electric motor, and the fan propeller is arranged in a plane that is substantially perpendicular to the midplane of the printed circuit card. It is then possible to adjust the height of the propeller relative to the card so as to distribute the air stream accurately in two streams on either side of the card.

Advantageously, at least 60%, in particular in the range 70% to 90%, of the stream of air driven by the fan means sweeps over one of the main faces of the printed circuit card, in particular its top face. It is preferable for the top face to be the face that is in contact with the larger cooling air stream for at least two reasons: firstly the electronic components that need to be cooled are generally mounted on the top face of the card; and secondly, it is easier to arrange the card at the back of the box, given the space occupied in the box by connectors.

Preferably, the box includes at least one opening formed in a second wall facing the first wall.

Also preferably, the printed circuit card is provided with at least one ventilation through opening allowing at least a portion of the air stream driven by the fan means to pass through.

Preferably, at least one of the ventilation through openings in the printed circuit card faces at least one opening formed in a wall of the box.

In a variant, at least one of the inside walls of the box facing the main faces of the printed circuit card is provided with ribs and/or with deflectors suitable for modifying the flow of at least a portion of the air stream driven by the fan means.

The ribs may project from the bottom wall of the box and may be in contact with the bottom face of the printed circuit card.

The deflectors may project from the top wall of the box and may be at a distance from the top face of the printed circuit card.

Advantageously, the electronic components are mounted on the printed circuit card, and the ribs and/or the deflectors are suitable for bringing at least a portion of the stream of air driven by the fan means towards the location for a hard disk and/or towards one or more of said electronic components. The arrangements on the inside wall of the box thus serve to guide the cooling air stream towards those zones that need it most.

Preferably, the box is substantially in the shape of a rectangular parallelepiped, with a bottom wall and a top wall facing main faces of the printed circuit card, the top wall of the box not having any ventilation through openings.

In an embodiment, the box is substantially in the form of a rectangular parallelepiped, the fan means being placed on the bottom wall of the box and mounted in an opening formed in a side wall of said box, said bottom wall presenting a step and/or a rising ramp facing said fan. The ramp and/or the step may be defined by ribs in order to confine at least a portion of the air stream and control its flow within the box.

BRIEF DESCRIPTION OF THE DRAWINGS

Other characteristics and advantages of the invention appear on reading the following description of a particular, non-limiting embodiment of the invention.

Reference is made to the accompanying drawings, in which:

FIG. 3 is a diagrammatic perspective view of the FIG. 1 bottom half-shell once it has been fitted with the printed circuit card carrying its electronic components and its electrical connection means; and FIG. 4 is another view of the FIG. 3 bottom half-shell in which the printed circuit card is also provided with a removable hard disk support, the bottom half-shell then being ready for assembling with the top half-shell of FIG. 2.

DETAILED DESCRIPTION OF THE PREFERRED EMBODIMENTS

In order to make them easier to read, the figures are diagrammatic and are not necessarily to scale between the various components shown, each element that is shown retaining the same reference throughout the figures.

Figure 1:
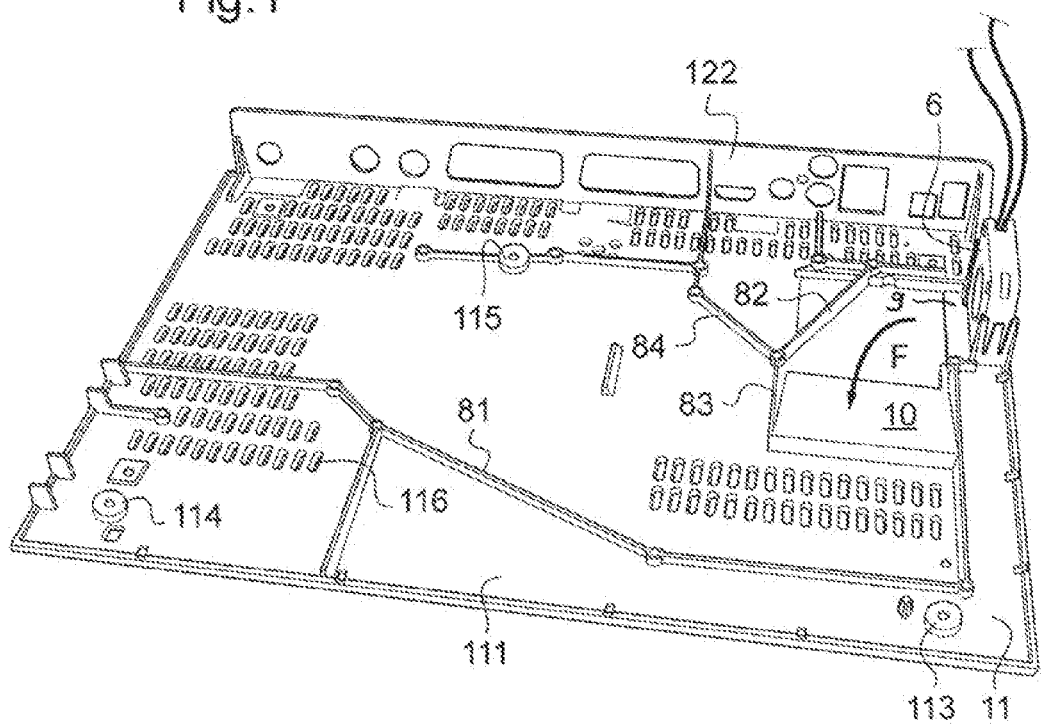
FIG. 1 is a diagrammatic perspective view of the bottom half-shell of a box for protecting a hard disk docking device of the invention.
Figure 2:
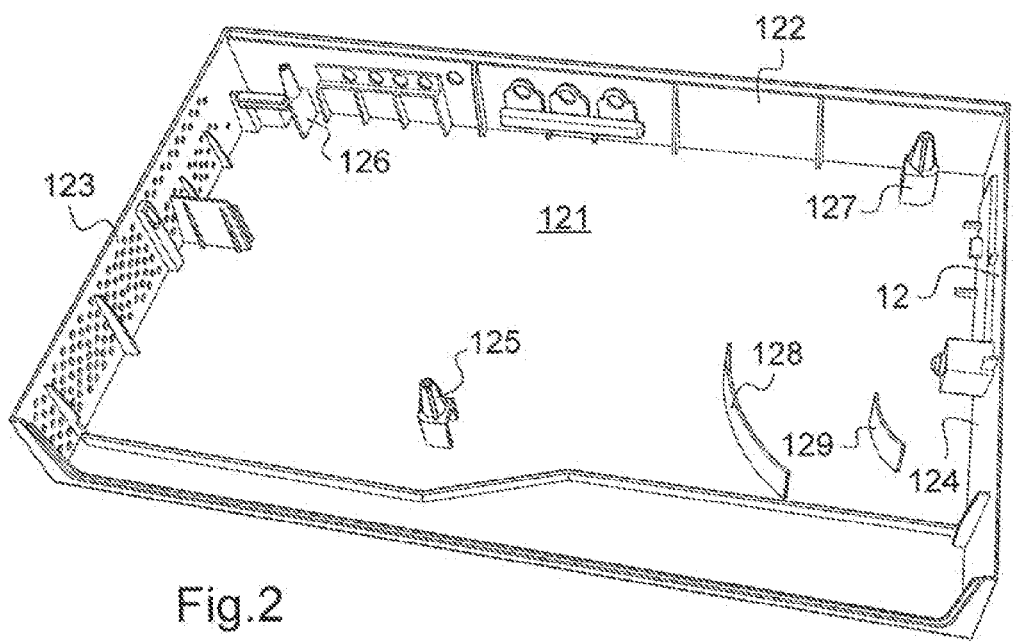
FIG. 2 is a diagrammatic perspective view of the top half-shell of a box for protecting a hard disk docking device of the invention.

With reference to FIGS. 1 to 4, the docking device in accordance with the invention comprises a box 1 fitted with a printed circuit card 2 on which various electronic/electrical components are mounted. The device is also designed to receive a removable hard disk (not shown) by insertion into a support in the form of a component having slideways 3 mounted on the card 2 (FIG. 4). The box comprises a first half-shell 11 referred to as a bottom half-shell, and a second half-shell 12 referred to as a top half-shell, which half-shells are provided with means for being secured to each other so as to define a space for receiving the hard disk and the printed circuit card 2 together with its electronic/electrical components.

In the present application, the terms: "top"; "bottom"; "side"; "up"; or "down" refer to the position occupied by the components of the device of the invention when they are arranged in a normal operation mode, and should be understood in the light of the figures in order to facilitate understanding, without having any limiting character.

The bottom half-shell 11 has a bottom wall 111 and a back wall 112, whereas the top half-shell 12 comprises a top wall 121, a front wall 122, and two side walls 123 and 124, such that once the two half-shells 11 and 12 are assembled together they define a box 1 substantially in the form of a rectangular parallelepiped. In this example, the half-shells are made of polymer material, in particular a thermoplastic material of polyethylene, polyamide, or acrylonitrile-butadiene-styrene type, and they are obtained in known manner by injection molding. This technique is advantageous since it enables complex shapes to be obtained in a manner that is much easier than, for example, using sheet-metal shaping techniques. As described in greater detail below, it is particularly advantageous in the context of the invention since it makes it possible, without difficulty, to obtain boxes having grooves, steps, projecting elements, ribs, . . . .

The half-shells 11 and 12 are assembled together by screws (not shown) that are passed through the top half-shell 12 via three screw wells 125, 126, and 127 formed in its top face 121 and that coincide, in the assembled position, with three orifices (not shown) formed in the printed circuit card 2 and with three orifices 113, 114, and 115 formed in the bottom face 111 of the bottom half-shell 11.

As mentioned above, various electronic components are mounted on the printed circuit card 2. These comprise in particular: a microprocessor (not shown in the figures) that needs to be fitted with a radiator and then inserted in a perforated metal box 8 that is mounted on the card 2, the metal box providing the microprocessor with electromagnetic shielding; and a tuner (also now shown in the figures) that is protected by a perforated metal box 4 in order to provide electromagnetic shielding. In known manner, it will be understood that the term "tuner" covers means for sending and/or receiving signals. In addition to the card itself, the tuner and the microprocessor are specifically the two electronic components that are the most likely to become hot in normal operation, together with the hard disk when it is inserted in its support 3.

A smart card reader 5 is also mounted on the card 2 together with other components that are not described in detail herein.

It is therefore appropriate to provide the device with an incorporated ventilation system capable of cooling effectively the card 2 and those components that are mounted on the card and that are the most likely to become hot, in particular the microprocessor, the tuner, and the hard disk, while avoiding spoiling the appearance of the device.

The ventilation system in this embodiment of the invention comprises the following elements: a fan 6 and arrangements provided in the walls of the box 1 and in the printed circuit card 2, which arrangements comprise, as described in detail below, projecting elements and openings in the walls of the box 1 and openings in the printed circuit card 2.

In known manner, the fan 6 is a motor-driven fan using an electric motor that is suitable for turning a propeller about its axis. This type of fan is also referred to as an axial fan. The fan is placed on the bottom inside wall 111 of the bottom half-shell 11 and it is mounted in an opening formed in the side wall 124 of the top half-shell 12. Mounting takes place via two side uprights 7 that form portions of the bottom wall 111 and that are provided with grooves that enable the fan 6 to be snap-fastened without requiring any special tooling. On the facing side wall 123, opposite from the side wall 124 in which the fan 6 is mounted, there are provided ventilation openings (not shown) in the form of small holes distributed over at least a portion of the wall in question.

Cooling air is thus taken by the fan 6 from outside the box 1 via the opening in which it is mounted. The stream of air delivered by the fan 6 into the box 1 may thus be exhausted at least in part through these openings arranged facing it.

The printed circuit card 2 is mounted in the bottom half-shell 11 and rests on a set of ribs 81, 82, 83, 84, and 85 projecting from the bottom inside wall 111 of the bottom half-shell 11.

The fan 6 is placed on the bottom wall 111 of the bottom half-shell 11 in a zone that is situated further down than the remainder of the bottom wall 111. In the immediate vicinity of the fan 6, there is provided a step 9 followed by a rising ramp 10 (FIG. 1) that is defined laterally by two of the above-mentioned ribs 82 and 83, and that terminates in a threshold.

The fan 6 is located relative to the printed circuit card 2 in such a manner as to project a stream of air against one of the edges of the card 2: the fan propeller is arranged substantially perpendicularly to the midplane of the card. The height of the fan propeller relative to the height of the card in the box and the configuration of the above-mentioned step and ramp are adjusted in such a manner that about 60% to 70% of the stream of air propelled by the propeller sweeps over the top face of the card 2 (this stream is referred to below as the top air stream) while the remainder of the air stream (referred to below as the bottom air stream) sweeps over the bottom face of the card 2.

The ribs 82 and 83 defining the ramp 10 perform two functions: firstly, like the other ribs provided on the bottom wall 111 of the bottom half-shell 11, they serve to support the printed circuit card 2; and secondly they also serve to channel and guide the portion of the air stream delivered by the fan 6 and that sweeps over the bottom face of the card 2. If reference is made particularly to FIGS. 1 and 3, the flow of the bottom air stream along the bottom face of the card 2 can be visualized: the bottom air stream follows the ramp 10 turning through 90° relative to the direction in which it was initially driven by the propeller (arrow F in FIG. 1), and then once the threshold is reached it rises (or at least a portion of it does) via the first through opening 21 formed in the card 2 (FIG. 3). Once it has reached the top face of the card 2 it rejoins the top air stream and a portion of these streams is subsequently extracted via the other opening 22 formed in the card 2.

As can be seen in FIGS. 3 and 4, the openings 21 and 22 are located facing the hard disk support 3 so that the air that is admitted via the opening 21 and exhausted via the opening 22 runs along the bottom face of the hard disk in order to optimize cooling thereof. Specifically, the air admitted via the opening 21 flows between the bottom face of the hard disk and the top face of the card 2 before being exhausted via the opening 22.

Since this other opening 22 faces small openings 116 organized in two rows in the bottom wall 111 of the bottom half-shell 11, the air as taken in this way can pass through or pass back through the card 2 in order to be exhausted out from the box 1 via these openings 115. Another portion of the bottom air stream continues running along the surface of the bottom face of the card 2, guided by the converging ribs 81 and 84 in order to enhance cooling of the respective zones of the card 2 that have the microprocessor and the tuner mounted thereon. Finally, the portion of the bottom air stream that reaches the side wall 123 opposite from the wall 124 in which the fan 6 is mounted is exhausted at least in part, as mentioned above, via the openings formed in said wall. It should be observed that the bottom wall 111 of the bottom half-shell 11 also contains a plurality of rows of ventilation openings 116 in the proximity of said side wall 123, through which a portion of the bottom air stream is also capable of escaping from the box 1.

Consideration is given below to the top air stream. This stream sweeps over the top face of the card 2. A portion thereof is channeled by two deflectors 128 and 128 (FIG. 2) projecting from the inside face of the top wall 121 of the top half-shell 12. These deflectors have substantially concentric curved walls and they are of a height such that their ends remain at a distance from the top face of the card 2. The air stream passage that is closest to the wall of the half-shell is thus caused, by the deflectors 128 and 129, to converge towards the location 3 of the support for the removable hard disk, in order to cool the hard disk when it is inserted in said support. The remainder of the top air stream continues its route over the top face of the card 2 and reaches the side wall 123 opposite from the wall 214 in which the fan 6 is mounted: like the bottom air stream, it is then exhausted at least in part through the openings formed in said side wall 123.

It should be observed that the box 1 of the invention is also provided in known manner with openings arranged to face grounding surfaces formed on the surface of the hard disk, when the disk is inserted in its support. In manner that is likewise known, the back wall 112 is provided with a variety of openings, needed in particular for passing electrical connector elements.

Naturally, the invention is not limited to the embodiment described and embodiment variations may be made thereto without going beyond the ambit of the invention as defined by the claims.

Thus, the half-shells 11 and 12 constituting the box 1, or at least one of them, may alternatively be made of metal. They may also present some other configuration, in particular, instead of the top half-shell, the bottom half-shell may carry at least one, two, or three of the side or front walls 123, 124, or 122. The two half-shells 11 and 12 may also be secured to each other by mechanical means other than screws, e.g. by a system of hinges, slideways, snap-fastening, adhesive, etc. . . .

The invention may also be applied to devices in which the hard disk is not necessarily removable, and to devices that are not designed to contain hard disks whether removable or otherwise. Under such circumstances, the guide means that are more particularly dedicated to the hard disk are eliminated or their configuration is adapted.

The configuration of the ribs and of the deflectors, and their locations on one or other of the hard disks may be adapted as a function of the locations on the printed circuit card 2 of the electronic elements that are the most likely to become hot.

It should be observed that the fan is located close to the position of the hard disk in order to cool the hard disk directly. At least a portion of the air stream driven by the fan is directed towards the hard disk in order to cool it first, prior to reaching the electronic components such as the processor and the tuner. Thus, the air stream received by the hard disk has not had time to heat up in contact with the card 2 and the electronic components it carries. However other respective configurations between the fan 6 and the location 3 of the hard disk are naturally possible.

The position of the fan 6 relative to the card 2 may also be adjusted in order to modify the distribution between the top and bottom air streams.

What is claimed is:

1. A docking device for a removable device such as a hard disk, the device comprising a protective box having inside walls and a bottom wall housing an electronic unit including a printed circuit card and fan means arranged in or in the vicinity of an opening formed in a first wall of the protective box, said box also providing a location for a removable device, said fan means being arranged in the vicinity of an edge of the printed circuit card so that the air stream delivered by said fan means sweeps over both main faces of the printed circuit card, guide means being designed to guide at least a portion of the top air stream and at least a portion of the bottom air stream delivered by the fan directly to the location for a removable device, wherein at least one of the inside walls of the box facing the main faces of the printed circuit card is provided with at least one rib and with deflectors suitable for modifying the flow of at least a portion of the air stream driven by the fan means, and wherein the ribs project from the bottom wall of the box and are in contact with the bottom face of the printed circuit card;

wherein the printed circuit card is provided with at least a first ventilation opening allowing at least a portion of the bottom air stream guided by the ribs under the location of the removable device to pass through to reach the top face of the printed circuit card and rejoin the top air stream and wherein the printed circuit is provided with a second ventilation opening allowing at least a portion of the rejoined stream to exhaust.

2. The device according to claim 1, wherein electronic components are mounted on the printed circuit card, and wherein guide means are also provided for guiding at least a portion of the air stream towards at least one of said electronic components.

3. The device according to claim 1, wherein the fan means comprise an axial type fan comprising an electric motor driving a propeller.

4. The device according to claim 3, wherein the propeller of the fan is arranged in a plane that is substantially perpendicular to the midplane of the printed circuit card.

5. The device according to claim 1, wherein at least 60% of the stream of air driven by the fan means sweeps over one of the main faces of the printed circuit card.

6. The device according to claim 1, wherein the box includes at least one opening formed in a second wall facing the first wall.

7. The device according to claim 1, wherein the printed circuit card is provided with at least one ventilation through opening allowing at least a portion of the air stream driven by the fan means to pass through.

8. The device according to claim 7, wherein at least one of the ventilation through openings in the printed circuit card faces at least one opening formed in a wall of the box.

9. The device according to claim 1, wherein the deflectors project from the top wall of the box and are at a distance from the top face of the printed circuit card.

10. The device according to claim 1, wherein electronic components are mounted on the printed circuit card, and wherein at least one of the ribs and the deflectors are suitable for bringing at least a portion of the stream of air driven by the fan means towards at least one of the location for a removable device and one or more of said electronic components.

11. The device according to claim 1, wherein the box is substantially in the shape of a rectangular parallelepiped, with a bottom wall and a top wall facing main faces of the printed circuit card, the top wall of the box not having any ventilation through openings.

12. The device according to claim 1, wherein the box is substantially in the form of a rectangular parallelepiped, the fan means being placed on the bottom wall of the box and mounted in an opening formed in a side wall of said box, said bottom wall presenting at least one of a step and a rising ramp facing said fan means.

13. The device according to claim 12, wherein at least one of the ramp and the step are defined by ribs.

14. The device according to claim 5, wherein the stream of air driven by the fan means sweeps over the top face of the printed circuit card.

15. The device according to claim 5, wherein 70% to 90% of the stream of air driven by the fan means sweeps over one of the main faces of the printed circuit card.

16. The device according to claim 2, wherein the electronic components are a microprocessor and a tuner.

17. A docking device, comprising:
    a protective box housing;
    an electronic unit including a printed circuit card;
    a fan in communication with an opening in a first wall of the protective box;
    a removable device being received in the protective box housing;
    said fan arranged partly on each side of both main surfaces of the printed circuit card and generating an air stream which sweeps over both main surfaces of the printed circuit card;
    guides mounted on the protective box housing for directly delivering a portion of the top air stream and at least a portion of the bottom air stream to the removable device;
    wherein the printed circuit card is provided with at least a first ventilation opening allowing at least a portion of the bottom air stream under the location of the removable device to pass through to reach the top face of the printed circuit card and rejoin the top air stream and wherein the printed circuit card is provided with a second ventilation opening allowing at least a portion of the rejoined stream to exhaust.

\* \* \* \* \*